(12) United States Patent
Fujii et al.

(10) Patent No.: US 6,552,694 B1
(45) Date of Patent: Apr. 22, 2003

(54) SEMICONDUCTOR DEVICE AND FABRICATION METHOD THEREOF

(75) Inventors: Tomoharu Fujii, Nagano (JP); Shigeru Okamura, Nagano (JP); Tsutomu Higuchi, Nagano (JP); Masatoshi Akagawa, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 67 days.

(21) Appl. No.: 09/609,974

(22) Filed: Jul. 6, 2000

(30) Foreign Application Priority Data

Jul. 13, 1999 (JP) ............................................. 11-198618

(51) Int. Cl.⁷ ............................................... H01Q 11/12
(52) U.S. Cl. ........................................ 343/895; 343/702
(58) Field of Search ................................ 340/572, 539; 257/679, 778; 343/895, 732, 741, 742, 866, 867, 873

(56) References Cited

U.S. PATENT DOCUMENTS 4,857,893 A    8/1989   Carroll ...................... 340/572

5,387,551 A    2/1995   Mizoguchi et al. .......... 437/209
5,710,458 A    1/1998   Iwasaki ....................... 257/679
6,301,119 B1  10/2001   Thevenot et al. ............ 361/737

FOREIGN PATENT DOCUMENTS

| EP | 0 547 563 A1 | 6/1993 |
| EP | 0 737 935 A2 | 10/1996 |
| EP | 0 737 935 A3 | 10/1996 |
| FR | 2753819      | 3/1998 |

OTHER PUBLICATIONS

European Communication dated Oct. 18, 2002.

*Primary Examiner*—Don Wong
*Assistant Examiner*—James Clinger
(74) *Attorney, Agent, or Firm*—Staas & Halsey LLP

(57) ABSTRACT

A semiconductor device with an antenna including one or more antenna units for sending and receiving signals and a semiconductor element electrically connected to the antenna units, wherein the antenna units are formed by pressing or etching a thin metal sheet with substantially the same flat surface size as the semiconductor element, and the antenna units are integrally coupled to the surface of the semicondcutor element. The antenna units are formed in a plurality of layers separated by insulating layers, and the antenna units formed on the respective layers are connected electrically in series with each other.

20 Claims, 6 Drawing Sheets

SEMICONDUCTOR DEVICE AND FABRICATION METHOD THEREOF

BACKGROUND OF THE INVENTION

1. Field of the Invention

The present invention relates to a semiconductor device with an antenna used for a contactless IC card or the like and a fabrication method thereof.

2. Description of the Related Art

A contactless IC card, as shown in FIG. 11, comprises a semiconductor element 12 for sending and receiving signals, an antenna 10 in the form of a flat coil electrically connected to the semiconductor element 12, and card-like films 14 for holding the antenna 10 and the semiconductor element 12 from the two sides thereof, thereby forming a thin card as a whole.

The antenna 10 can be formed by pressing a thin metal sheet into a predetermined shape of a coil, or etching a conductive layer formed on one side of a film into a predetermined shape of coil.

The conventional contactless IC card, as shown in FIG. 11, has the antenna 10 arranged along the outer peripheral edge of the card. This arrangement is employed in view of the fact that the communication characteristics of the antenna 10 are determined by the area defined by the loop and the number of turns of the antenna, and also under the restraint of the size of a "card", the loop of the antenna 10 is formed along the outer peripheral edge while at the same time taking portability into account.

For example, the antenna can be formed by pressing or etching a thin metal sheet (e.g. an iron sheet) which is about 0.1 mm thick. In this case, the clearance between one antenna and an adjacent antenna usually ranges from 0.1 mm to 0.5 mm though it is generally determined by the number of turns of the antenna.

Also, the surface of the antenna formed as described above can be plated with nickel. Also, the surface of the portions of the antenna to which bonding wires are bonded, to electrically connect a semiconductor element and the antenna, can be plated with gold or palladium.

The requirement for a large area for the antenna 10 as in the conventional IC card, however, limits the possibility of reducing the size of the electronic devices and hence the applicability to other areas.

In view of the characteristics of electronic parts having such communication functions as described above, the object of the present invention is to provide a semiconductor device, and a preferred method of fabrication thereof, which can reduce the size of the electronic parts having such communication characteristics and are readily applicable to various electronic equipment.

SUMMARY OF THE INVENTION

In order to achieve the aforementioned object, the present invention is configured as described below.

According to one aspect of the invention, there is provided a semiconductor device with an antenna comprising one or more antenna units for sending and receiving signals, and a semiconductor element electrically connected to the antenna units, wherein the antenna units are formed by pressing or etching a thin metal sheet with substantially the same flat surface size as the semiconductor element, and the antenna units are integrally coupled to the surface of the semiconductor element.

The antenna units are formed in a size capable of being arranged within the surface of the semiconductor element and coupled to the surface of the semiconductor element.

The antenna units are formed in a plurality of layers, separated by insulating layers, and the antenna units formed on the respective layers are electrically connected in series with each other. By adjusting the number of the layers of the antenna unit, the required conditions such as the number of turns of the antenna can be met.

Also, the outer surface of the antenna is covered with a sealing resin.

Another feature of this invention is that connecting terminals protruded toward the antenna unit of an adjacent layer are formed on one of the surfaces of antenna units and the antenna units are electrically connected with each other through the connecting terminals.

Still another feature of the invention is that the antenna units are electrically connected with each other by using an anisotropic conductive adhesive film or an anisotropic conductive adhesive. The use of the anisotropic conductive adhesive film or the anisotropic conductive adhesive facilitates the electrical connection and integration between adjacent antenna layers.

According to another aspect of the invention, there is provided a method of fabricating a semiconductor device with an antenna comprising one or more antenna units for sending and receiving signals and a semiconductor element electrically connected with the antenna units, comprising the steps of forming a plurality of semiconductor elements at predetermined positions on a semiconductor wafer, forming an antenna frame having a plurality of antenna units at the positions corresponding to the predetermined positions by pressing or etching a thin metal sheet, and setting said semiconductor wafer and said antenna frame in register with each other in an opposed relation to each other in accordance with the positions of said semiconductor elements and said antenna units, coupling by connecting each of said semiconductor elements and the corresponding antenna units with each other electrically, and cutting off said semiconductor wafer and said antenna frame to the profile of each of said semiconductor devices.

Also, according to another aspect of the invention, there is provided a method of fabricating a semiconductor device with an antenna comprising one or more antenna units for sending and receiving signals and a semiconductor element electrically connected with the antenna units, comprising the steps of forming a plurality of semiconductor elements at predetermined positions on a semiconductor wafer, forming antenna frames, each of which has a plurality of antenna units at the positions corresponding of the predetermined positions, by pressing or etching a thin metal sheet, forming a multilayered member by integrating said antenna frames, each of which is separated by an adhesive film, and by connecting antenna units of said antenna frames electrically in series with each other, and setting said semiconductor wafer and said multilayered member in register with each other in an opposed relation to each other in accordance with the positions of said semiconductor elements and said antenna units, coupling by connecting each of said semiconductor elements and the corresponding antenna units with each other electrically, and cutting off said semiconductor wafer and said multilayered member to the profile of each of said semiconductor devices.

The antenna units of the antenna frames, each of which is separated by an adhesive film, are electrically connected in series with each other through the connecting terminals on a surface of the antenna unit formed into protrusions toward a surface of an adjacent antenna unit.

The outer surface of the antenna frame is covered with a sealing resin before the semiconductor wafer, having the antenna frame, is cut off to the profile of each of the semiconductor devices.

DESCRIPTION OF THE PREFERRED EMBODIMENTS

A preferred embodiment of the invention will be explained in detail below with reference to the accompanying drawings.

A semiconductor device with an antenna according to this invention is fabricated in such a manner that one or more antenna units used by being connected to a semiconductor element for sending and receiving signals are produced by pressing or etching a thin metal sheet, and the antenna units are electrically connected to the semiconductor element.

Figure 1:
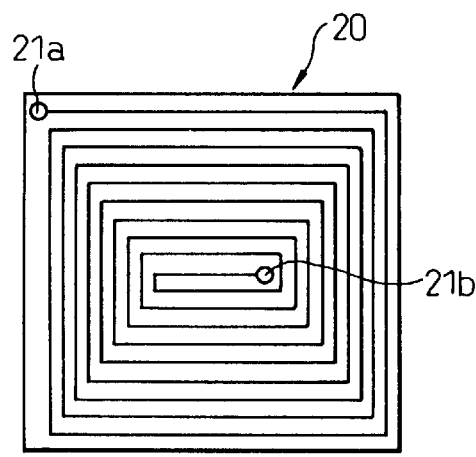
FIG. 1 is a plan view showing an example of an antenna unit used with a semiconductor device with an antenna.

FIG. 1 shows an example of an antenna unit 20 formed by pressing or etching a thin metal sheet. The antenna unit 20 according to this embodiment is designed in such a shape that a coil is laid over the entire surface of the semiconductor element 12.

The actual operation of working the antenna unit 20 is performed by a method in which a long frame with a multiplicity of pieces of the antenna unit 20 is formed by pressing and each antenna unit 20 is produced from the frame, or by a method in which a frame having a multiplicity of pieces of the antenna unit 20 in two directions is formed by etching so that each antenna unit 20 is produced from this frame.

Numerals 21a and 21b designate connecting terminals for electrically connecting the antenna unit 20 to the electrode terminals of the semiconductor element 12. The connecting terminal 21a is formed at an end of the outer peripheral portion of the antenna unit 20, and the connecting terminal 21b is formed at an end of the inner peripheral portion.

Figure 2:
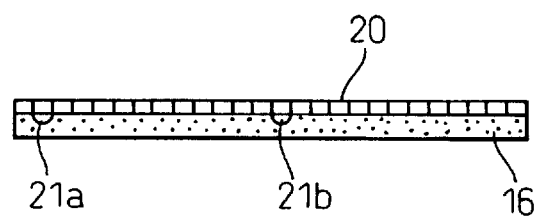
FIG. 2 is a sectional view showing an antenna unit to which an anisotropic conductive adhesive film is bonded.

As shown in FIG. 2, the connecting terminals 21a and 21b are formed in such a manner as to protrude from the flat surface on which the antenna unit 20 is wound. The protrusions can be easily formed in parts of a thin metal sheet punched during the pressing step for forming the coiled antenna unit 20. In forming the antenna unit 20 by etching, on the other hand, a pattern of the antenna unit 20 is formed by etching the thin metal sheet and the portions to be formed with the connecting terminals 21a and 21b are formed into the protrusions.

FIG. 2 shows an antenna unit 20 which has an anisotropic conductive adhesive film 16 bonded to the side of the antenna unit 20 from which the connecting terminals 21a and 21b are protruded. The anisotropic conductive adhesive film 16 is used for coupling by electrically connecting the antenna unit 20 to the semiconductor element 12.

Figure 3:
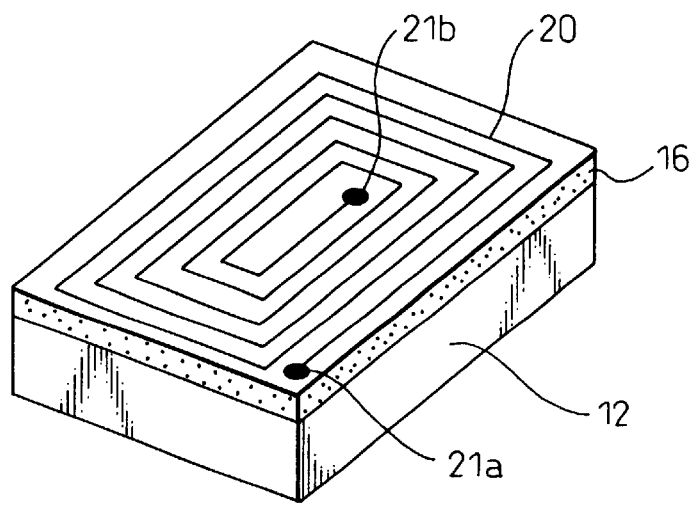
FIG. 3 is a perspective view of a semiconductor device with an antenna.
Figure 4:
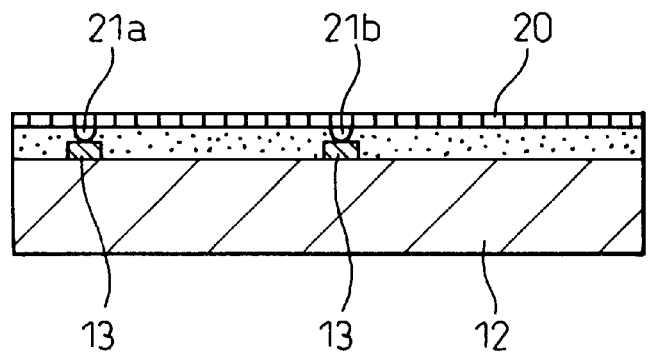
FIG. 4 is a sectional view of a semiconductor device with an antenna.

FIG. 3 is a perspective view showing the state in which the antenna unit 20 is coupled to the semiconductor element 12 through the anisotropic conductive adhesive film 16, and FIG. 4 is a sectional view of the same.

As shown in FIG. 4, connecting pads 13 for coupling with the connecting terminals 21a and 21b of the antenna unit 20 are formed on the surface of the semiconductor element 12 and slightly protrude therefrom. The antenna unit 20 to which the anisotropic conductive adhesive film 16 is bonded is set in register with the semiconductor element 12 and, by heating and pressing, the antenna unit 20 is bonded integrally with the semiconductor element 12, while connecting only the connecting pad 13 and the connecting terminals 21a, 21b electrically to each other.

FIG. 3 shows a semiconductor device with an antenna having the antenna unit 20, which is formed in the same flat shape as the semiconductor element 12, within the surface of the semiconductor element 12.

This semiconductor device, in which the antenna unit 20 is integrally built-in, constitutes a device having a function similar to the conventional contactless IC card. Even in the case where a pattern of the antenna unit 20 is required to be laid with high density within the surface of the semiconductor element 12 to obtain the required communication characteristics, the required antenna pattern can be formed by pressing or etching.

Figure 5A:
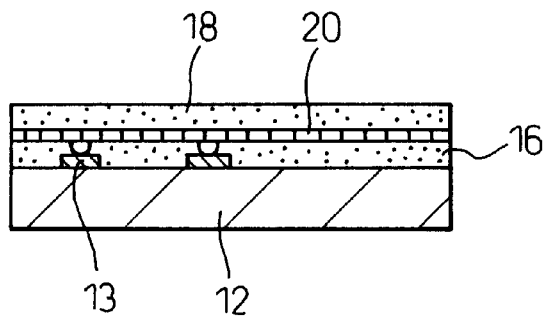
FIG. 5(a) is a sectional view of a semiconductor device with an antenna according to another embodiment.
Figure 5B:
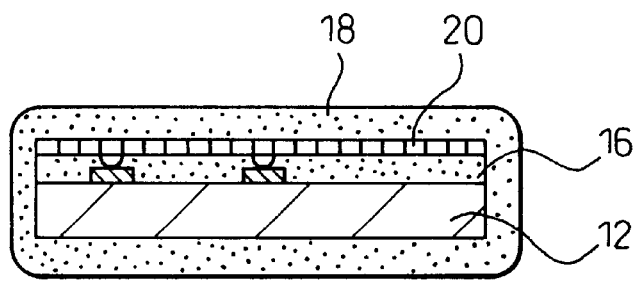
FIG. 5(b) is a sectional view of a semiconductor device with an antenna according to still another embodiment.

As shown in FIG. 5(a), the outer surface of the antenna unit 20 of the semiconductor device shown in FIG. 3 may be covered with a sealing resin 18 or, as shown in FIG. 5(b), the entire surface of the antenna unit 20 and the semiconductor element 12 may be covered with the sealing resin 18.

The semiconductor device according to this embodiment concerns the case in which the antenna unit 20 is formed in a single layer. In the case where the single layer cannot provide a sufficient number of turns of the antenna unit 20, the required number of turns can be obtained by integrating a plurality of the antenna units 20.

Figure 6A:
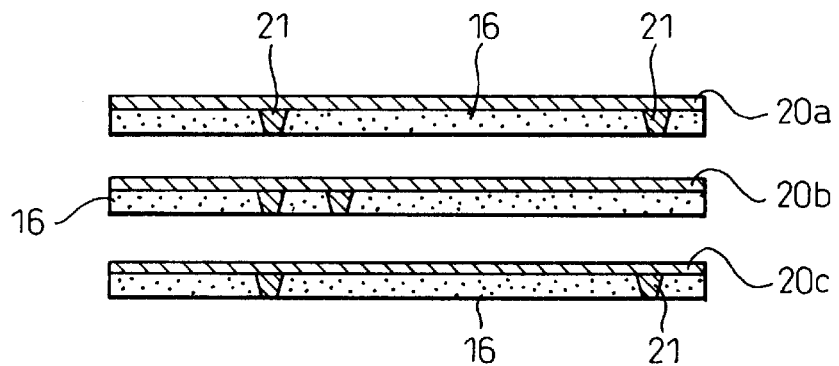
FIG. 6(a) is a diagram for explaining a method of fabricating a semiconductor device with an antenna having a plurality of antenna units formed in layers, in which an anisotropic conductive adhesive film is bonded to each antenna unit.
Figure 6B:
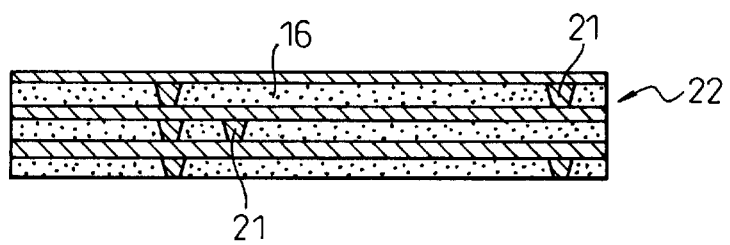
FIG. 6(b) is a diagram for explaining a method of fabricating a semiconductor device with an antenna having a plurality of antenna units formed in layers, in which a multilayered member is formed.
Figure 6C:
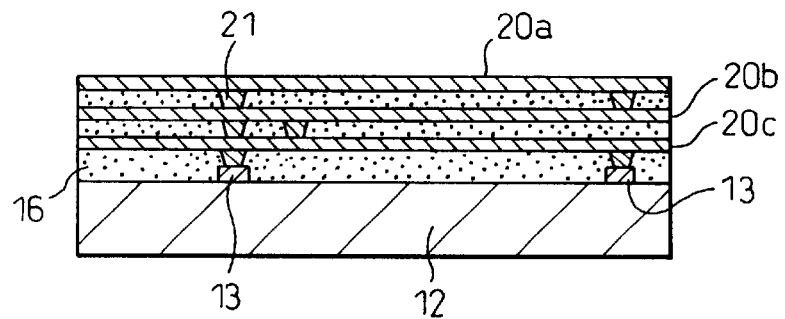
FIG. 6(c) is a diagram for explaining a method of fabricating a semiconductor device with an antenna having a plurality of antenna units formed in layers, in which the multilayered member is bonded to a semiconductor element.

FIGS. 6(a) to 6(c) show a method of fabricating a semiconductor device with an antenna comprising a plurality of antenna units integrated and arranged on the surface of the semiconductor element 12.

FIG. 6(a) shows the state in which anisotropic conductive adhesive films 16 are bonded to the antenna units 20a, 20b and 20c formed with a required pattern by pressing or etching. The antenna units 20a, 20b and 20c are each formed with protruded connecting terminals 21 for electrically connecting the layers in which the antenna units 20a, 20b and 20c are set and integrated in register to each other. The anisotropic conductive adhesive films 16 are bonded to that side of each of the antenna units 20a, 20b and 20c from which the connecting terminals 21 are projected.

FIG. 6(b) shows the state in which the antenna units 20a, 20b and 20c with the anisotropic conductive adhesive films 16 bonded thereto are set in register with each other, and by heating and pressing, are integrated into a multilayered member 22. By integrating the antenna units using the anisotropic conductive adhesive films 16, the antenna units 20a, 20b and 20c between the adjacent layers are electrically connected to each other with only the portions thereof formed with the connecting terminals 21.

FIG. 6(c) shows the state in which the multilayered member of the antenna units 20a, 20b and 20c is set in register with and bonded to the semiconductor element 12. Also, when bonding the multilayered member 22 of the antenna units to the semiconductor element 12, the anisotropic conductive adhesive film 16 may be used so that the connecting terminals 21 on the adhesive surface of the semiconductor element 12 can be electrically connected and integrated with the connecting pads 13. In place of the anisotropic conductive adhesive film 16, an anisotropic conductive adhesive may be coated to bond the antenna units 20a, 20b and 20c and the antenna multilayered member 22.

In this way, a semiconductor device with antenna units can be obtained with the antenna units 20a, 20b and 20c integrated within the surface of the semiconductor element 12. The integration of the antenna units 20a, 20b and 20c can produce a semiconductor device having the same plan as the semiconductor element 12 without enlarging the space in which the antenna units are arranged. Unlike in this embodiment, having formed therein the three layers of the antenna units 20a, 20b and 20c, the antenna units may be integrated in a greater number of layers. Thus, the integrated antenna units arrangement can produce a semiconductor device having the required communication characteristics. The semiconductor device formed using the antenna unit multilayered member 22 constitutes a product having an appearance similar to the semiconductor device shown in FIG. 3.

The method of fabricating a semiconductor device with antenna according to the embodiments described above is one for fabricating a semiconductor by coupling an antenna unit to each of the semiconductor elements 12 formed individually. A semiconductor device with an antenna having the same shape as the semiconductor element as described above can be obtained also by a method in which antenna units set in register with and coupled to a semiconductor wafer, after which the semiconductor wafer is cut to form the semiconductor devices, each with an antenna unit 20.

Figure 7:
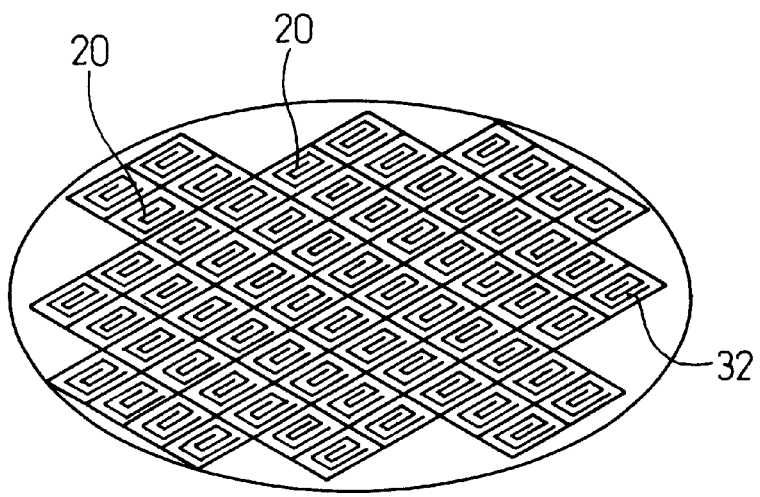
FIG. 7 is a diagram for explaining a method of fabricating a semiconductor device with an antenna using a semiconductor wafer.
Figure 7:
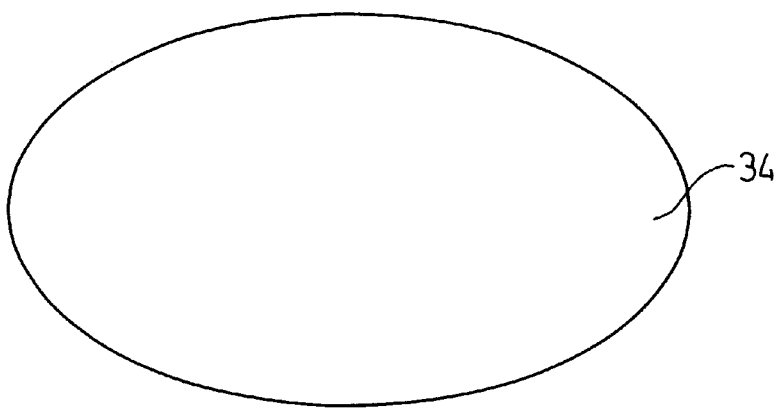
Figure 7:
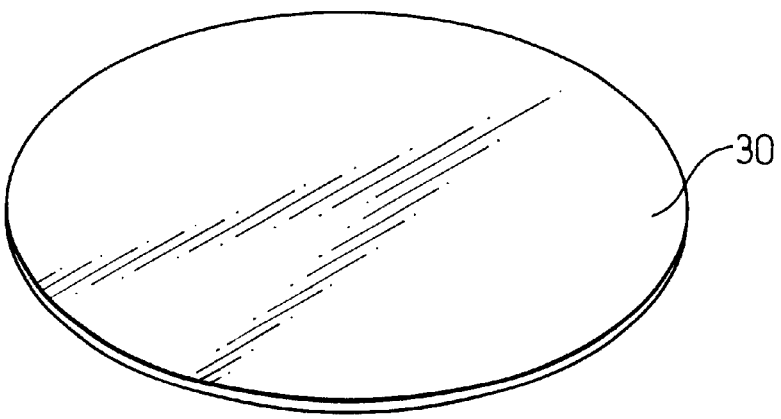

FIG. 7 shows a method of fabricating a semiconductor device with an antenna using a semiconductor wafer 30. The semiconductor wafer 30 is formed with semiconductor elements used for sending and receiving signals. Numeral 32 designates an antenna frame to be coupled by being electrically connected to each semiconductor element of the semiconductor wafer 30. The antenna frame 32 is formed as a large-sized frame in such a manner that each antenna unit 20 is formed into a predetermined pattern in accordance with the arrangement of each semiconductor element of the semiconductor wafer 30 and the adjacent antennas 20 are coupled by tie bars. The antenna frame 32 is formed by pressing or etching, and as in the aforementioned case, connecting terminals 21a and 21b are formed on each antenna unit 20.

The semiconductor wafer 30 and the antenna frame 32 are set in register with each other and, by being heated and pressed through an anisotropic conductive adhesive film 34, the semiconductor wafer 30 is bonded integrally with the antenna frame 32. As a result, each semiconductor element 12 and the corresponding antenna unit 20 are electrically connected and bonded to each other. The semiconductor wafer 30 and the antenna frame 32, after being thus integrally bonded to each other, are sliced at the cutting position of each semiconductor device thereby to produce each semiconductor device with antenna unit. When cutting the antenna frame 32, the tie bars are cut off so that the antenna unit of each semiconductor device comes to assume an independent form. The semiconductor device is obtained as a chip-sized product as in the embodiments described above.

Figure 8:
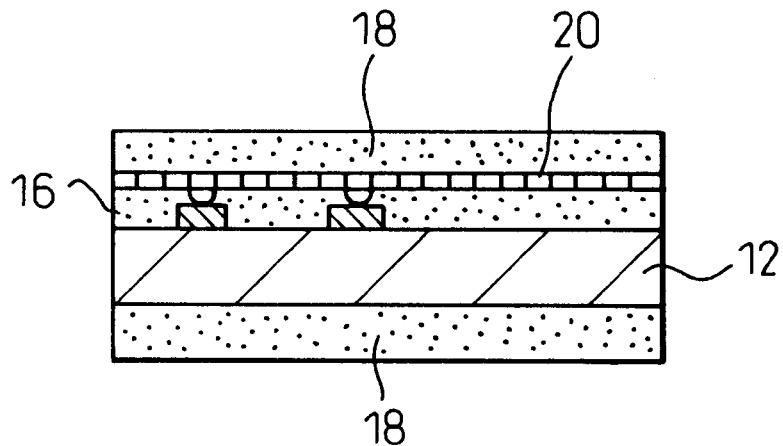
FIG. 8 is a sectional view of a semiconductor device with an antenna according to a further embodiment.

Before cutting off the frame and the wafer into the chip-sized semiconductor devices, the outer surface of the antenna frame 32 and the lower surface of the semiconductor wafer 30 are sealed to each other by a sealing resin 18 and then the individual semiconductor devices are cut off, thereby producing a semiconductor device shown in FIG. 8. With this semiconductor device, the outer surface of the antenna unit 20 and the lower surface of the semiconductor element 12 are sealed by the sealing resin 18.

The aforementioned method of fabricating a semiconductor device with an antenna by coupling the antenna frame 32 to the semiconductor wafer 30 has the advantage that the semiconductor devices can be efficiently fabricated. The antenna frame 32 can also be formed efficiently as a large-sized frame by etching, thereby contributing to a highly efficient fabrication. An individual antenna frame can of course be coupled to each semiconductor element formed on the wafer without using the large-sized antenna frame 32.

Figure 9:
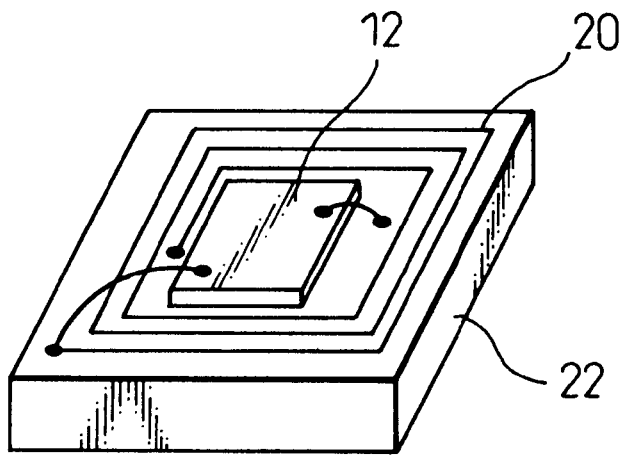
FIG. 9 is a sectional view of a semiconductor device with an antenna according to a still further embodiment.

In the semiconductor device with the antenna according to the embodiments described above, the antenna unit 20 is arranged in the surface of the semiconductor element 12. As shown in FIG. 9, however, the outline of the integrated member 22 formed by integrating the antenna units may be set to a larger size than the semiconductor element 12, so that the semiconductor element 12 is mounted on the integrated member 22. The integrated member 22, which is shown in FIG. 6(b) above, includes the antenna units 20a, 20b and 20c electrically interconnected by use of the anisotropic conductive adhesive film 16 into a single integrated member. The semiconductor element 12 is bonded and mounted on the outer surface of the integrated member 22. Then, the semiconductor element 12 and the antenna 20 are electrically connected by wire bonding.

Figure 10:
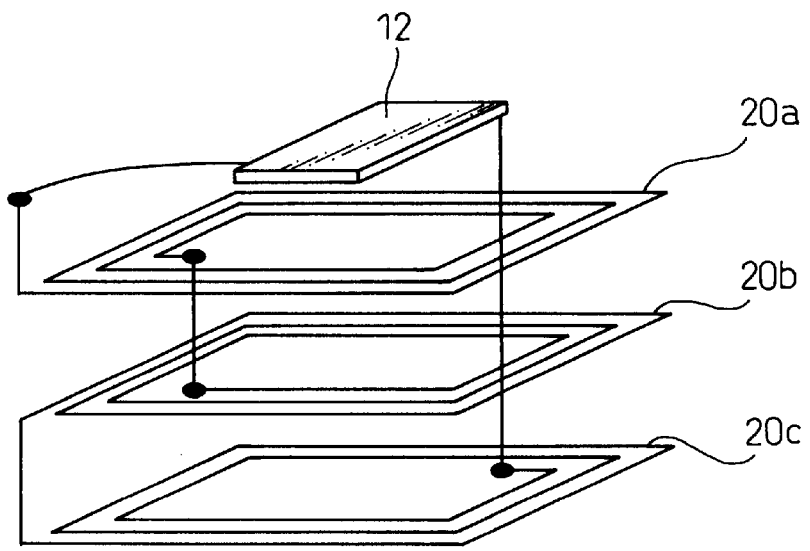
FIG. 10 is a diagram for explaining a configuration of the antenna units with antenna members arranged in layers.
Figure 11:
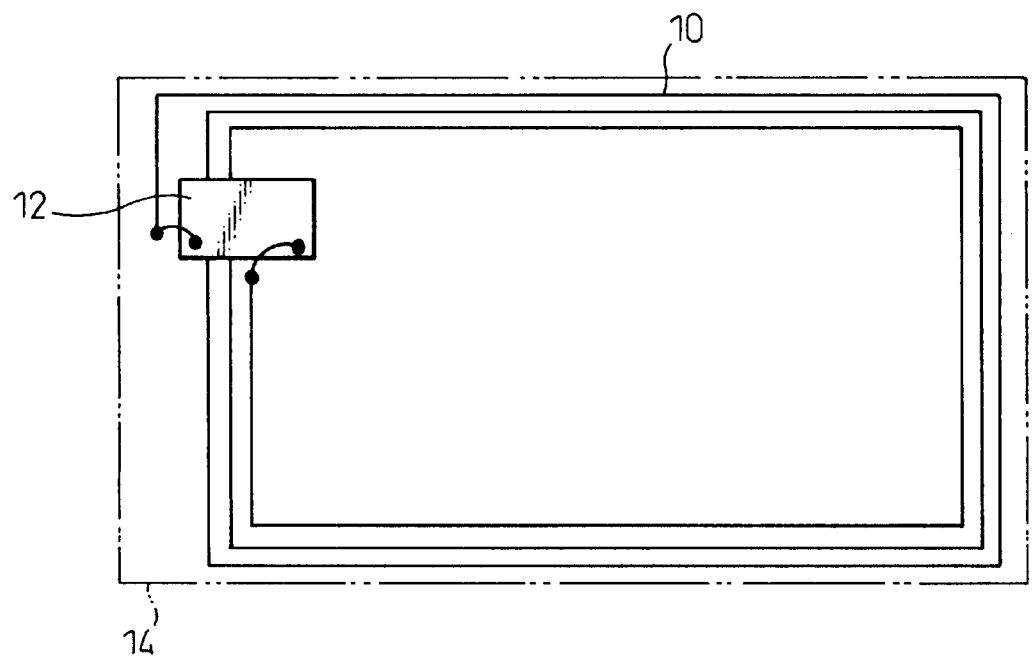
FIG. 11 is a diagram for explaining a configuration of an IC card.

FIG. 10 shows antenna patterns formed in the first, second and third layers and a structure for electrically connecting the antenna units 20a, 20b and 20c. The antenna units 20a, 20b and 20c are connected in series between the layers through the connecting terminals of each layer. The semiconductor element 12 is electrically connected in series to the ends of the antenna units 20a, 20b and 20c.

The electrical connection between the antenna unit 20 and the semiconductor element 12 can use wire bonding and is not limited to the use of the anisotropic conductive adhesive film 16 by which the connecting terminals and the opposed connecting pads arranged are connected to each other. Also, the connecting terminals and the opposed connecting pads can be connected by solder by way of solder bumps formed on the connecting pads. Also, an ordinary resin adhesive may be used instead of the anisotropic conductive resin film. Further, in the case of the semiconductor device shown in FIG. 9, the outer surface of the antenna unit 20 and the outer surface of the semiconductor element 12 can be sealed with a sealing resin.

As described above, the semiconductor device with an antenna according to this invention is formed with the antenna units by pressing or etching a thin metal sheet and has the advantage that it can be fabricated by using the conventional pressing technique and the conventional etching technique as they are.

Another feature of the semiconductor device with an antenna according to this invention is that the semiconductor device is formed substantially in the same size as the semiconductor element 12 and is therefore very small in size. This product can be used as an electronic part much smaller than the conventional IC card by utilization of the communication functions thereof. Also, the smaller size improves the portability, and commercial products easy to carry can be fabricated with a built-in semiconductor device. As described above, the semiconductor device according to the invention is expected to find wide applications in a variety of fields.

It will thus be understood that the semiconductor device with an antenna according to the invention, as described above, is provided as a product formed substantially in the same size as the semiconductor element. This semiconductor device, therefore, is expected to find application in contactless types of communications. Also, a method of fabricating the semiconductor device according to this invention makes it possible to fabricate a semiconductor device with an antenna both efficiently and easily.

What is claimed is:

1. A semiconductor device with an antenna, comprising:
   one or more antenna units for sending and receiving signals and a semiconductor element electrically connected to said antenna units,
   wherein said antenna units are formed with substantially a same flat surface size as said semiconductor element,
   wherein each of said antenna units includes connecting terminals protruding from a lower surface thereof,
   wherein said antenna units are integrally coupled to the surface of said semiconductor element by electrically connecting the connecting terminals of the antenna units with the semiconductor element,
   wherein said semiconductor element surface defines an area, and
   wherein the size of each of said antenna units is dimensioned to be received within the area.

2. A semiconductor device with an antenna according to claim 1,
   wherein said antenna units are formed on said surface in a plurality of layers each separated by insulating layers, and in different planes, and the antenna units formed on said respective layers are electrically connected in series with each other and to said surface of the semiconductor element.

3. A semiconductor device with an antenna according to claim 1,
   wherein an outer surface of said antenna is covered with a sealing resin.

4. A semiconductor device with an antenna according to claim 2,
   wherein connecting terminals protruded toward the antenna unit of an adjacent layer are formed on one of the surfaces of said antenna units, and
   wherein said antenna units are electrically connected with each other through said connecting terminals.

5. A semiconductor device with an antenna according to claim 4,
   wherein said antenna units are electrically connected with each other by using an anisotropic conductive adhesive film or an anisotropic conductive adhesive.

6. A semiconductor device with an antenna according to claim 2, wherein the outer surface of said antenna is covered with a sealing resin.

7. The device according to claim 1, wherein the antenna units are formed by pressing a thin sheet of metal.

8. The device according to claim 1, wherein the antenna units are formed by etching a thin sheet of metal.

9. A semiconductor device with an antenna according to claim 1, wherein the semiconductor element includes electrode terminals protruding upwardly, and corresponding to the connecting terminals of the antenna units, and the antenna units and the semiconductor element are integrally coupled by contacting the connecting terminals with the corresponding electrode terminals of the semiconductor element.

10. A semiconductor device with an antenna according to claim 1, wherein the semiconductor element includes electrode terminals protruding upwardly, and corresponding to the connecting terminal of the antenna unit, and the antenna units and the semiconductor element are integrally coupled by contacting the connecting terminals of a first one of the antenna units with the connecting terminals of a second one of the antenna units, and contacting the connecting terminals of the second one of the antenna units with the corresponding electrode terminals of the semiconductor element.

11. The semiconductor device with an antenna according to claim 1, wherein the connecting terminals on the antenna units include a first connecting terminal found at an outer end of an outer peripheral portion of the antenna units, and a second connecting terminal found at the an end of an inner peripheral portion of the antenna unit.

12. A method of fabricating a semiconductor device with an antenna, comprising one or more antenna units for sending and receiving signals and a semiconductor element electrically connected with said antenna units,
    comprising the steps of forming a plurality of semiconductor elements at predetermined positions on a semiconductor wafer, forming an antenna frame having a plurality of antenna units at positions corresponding to said predetermined positions, and setting said semiconductor wafer and said antenna frame in register with each other in opposed relation to each other in accordance with the positions of said semiconductor elements and said antenna units, coupling by connecting each of said semiconductor elements and the corresponding antenna units with each other electrically, and cutting off said semiconductor wafer and said antenna frame to profile of each of said semiconductor devices.

13. A method of fabricating a semiconductor device with an antenna according to claim 12,
    wherein an outer surface of said antenna frame is covered with a sealing resin before said semiconductor wafer, having said antenna frame, is cut off to the profile of each of said semiconductor devices.

14. A method according to claim 12, wherein the antenna units are formed by etching a thin sheet of metal.

15. A method according to claim 12, wherein the antenna units are formed by pressing a thin sheet of metal.

16. A method of fabricating a semiconductor device with an antenna, comprising one or more antenna units for sending and receiving signals and a semiconductor element electrically connected with said antenna units, comprising the steps of forming a plurality of semiconductor elements at predetermined positions on a semiconductor wafer, forming antenna frames, each of which has a plurality of antenna units at the positions corresponding to said predetermined positions, forming a multilayered member by integrating said antenna frames, each of which is separated by an adhesive film, and by connecting antenna units of said antenna frames electrically in series with each other, and setting said semiconductor wafer and said multilayered member in register with each other in an opposed relation to each other in accordance with the positions of said semiconductor elements and said antenna units, coupling by connecting each of said semiconductor elements and the corresponding antenna units with each other electrically, and cutting off said semiconductor wafer and said multilayered member to profile of each of said semiconductor devices.

17. A method of fabricating a semiconductor device with an antenna according to claim 16, wherein said antenna units of said antenna frames, each of which is separated by an adhesive film, are electrically connected in series with each other through connecting terminals on a surface of said antenna unit formed into protrusions toward a surface of an adjacent antenna unit.

18. A method of fabricating a semiconductor device with an antenna according to claim 16, wherein an outer surface of said antenna frame is covered with a sealing resin before said semiconductor wafer, having said antenna frame, is cut off to the profile of each of said semiconductor devices.

19. A method according to claim 16, wherein the antenna units are formed by pressing a thin sheet of metal.

20. A method according to claim 16, wherein the antenna units are formed by etching a thin sheet of metal.

* * * * *